US009082509B2

(12) United States Patent
August et al.

(10) Patent No.: US 9,082,509 B2
(45) Date of Patent: Jul. 14, 2015

(54) METHOD AND APPARATUS FOR READING VARIABLE RESISTANCE MEMORY ELEMENTS

(71) Applicants: Nathaniel J. August, Portland, OR (US); Liqiong Wei, Portland, OR (US)

(72) Inventors: Nathaniel J. August, Portland, OR (US); Liqiong Wei, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/720,002

(22) Filed: Dec. 19, 2012

(65) Prior Publication Data

US 2014/0169063 A1   Jun. 19, 2014

(51) Int. Cl.
*G11C 11/00* (2006.01)
*G11C 11/56* (2006.01)

(52) U.S. Cl.
CPC ............ *G11C 11/5607* (2013.01); *G11C 11/56* (2013.01); *G11C 11/5678* (2013.01)

(58) Field of Classification Search
CPC .. G11C 11/5607; G11C 11/56; G11C 13/004; G11C 13/0002; G11C 13/0004; G11C 13/0061
USPC ............... 365/145, 148, 158, 189.05, 189.07, 365/189.15, 191, 205, 163, 194
See application file for complete search history.

(56) References Cited

U.S. PATENT DOCUMENTS

| 5,699,300 | A  | * | 12/1997 | Akamatsu et al. ........ 365/189.04 |
| 6,577,525 | B2 | * | 6/2003  | Baker ............................ 365/148 |
| 8,134,395 | B2 | * | 3/2012  | Sommer ........................ 327/217 |
| 2002/0084815 | A1 | * | 7/2002 | Murphy et al. ................ 327/157 |
| 2004/0046597 | A1 | * | 3/2004 | Alon et al. .................... 327/278 |
| 2004/0062301 | A1 | * | 4/2004 | Yamaguchi et al. .......... 375/226 |
| 2006/0013040 | A1 |   | 1/2006  | Baker |
| 2007/0007536 | A1 | * | 1/2007 | Hidaka .......................... 257/72 |
| 2010/0020624 | A1 | * | 1/2010 | Mayor ..................... 365/189.15 |
| 2010/0142303 | A1 |   | 6/2010  | Park et al. |
| 2011/0032747 | A1 |   | 2/2011  | Yoon et al. |
| 2011/0051486 | A1 |   | 3/2011  | Chang et al. |
| 2011/0110142 | A1 |   | 5/2011  | Kitagawa et al. |

OTHER PUBLICATIONS

Datasheet from Texas Instruments "SN5474 Dual D-type Positive-Edge-Triggered Flip-Flops with Preset and Clear", Rev. 1988.*
A. Driskill-Smith, "Latest Advances and Future Prospects of STT-RAM", Grandis, Inc., Presentation to Non-Volatile Memories Workshop, University of California, San Diego, Apr. 11-13, 2010.*

(Continued)

*Primary Examiner* — Tan T. Nguyen
(74) *Attorney, Agent, or Firm* — Green, Howard & Mughal, LLP

(57) ABSTRACT

In some embodiments, detecting resistance in a resistive memory cell may be done using a pulse edge. For example, a pulse may be applied through a resistive memory data cell and another through a reference delay circuit to determine which path has the larger delay in order to determine the resistive state of the data cell in question.

19 Claims, 2 Drawing Sheets

(56) References Cited

OTHER PUBLICATIONS

Chen et al. "Advances and Future Prospects of Spin-Transfer Torque Random Access Memory", IEEE Trans. Magnet. vol. 46, No. 6, p. 1873 (2010).*

A. Driskill-Smith of Grandis, Inc., "Latest Advances and Future Prospects of STT-RAM", presentation on Apr. 12, 2010.*

TI SN5474 datasheet: "SN5474 Dual D-type Positive-Edge-Triggered Flip-Flops with Preset and Clear", rev. 1988 from Texas Instruments.*

International Search Report and Written Opinion Received for PCT Patent Application No. PCT/US2013/047818, Mailed on Oct. 15, 2013, 9 pages.

* cited by examiner

US 9,082,509 B2

METHOD AND APPARATUS FOR READING VARIABLE RESISTANCE MEMORY ELEMENTS

TECHNICAL FIELD

The present invention relates generally to variable resistance memory, and in particular, to circuits for reading variable resistance memory elements.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Several new types of solid-state, high-density, non-volatile memories store information using a memory element with a variable resistance. For example, the resistance of spin transfer torque—magnetic random access memory (STT) depends on the relative magnetization polarities of two magnetic layers. Other types of resistive memory include resistive RAM (ReRAM) and conductive bridging RAM (CBRAM), whose resistances depend on the formation and elimination of conduction paths through a dielectric or an electrolyte. There is also phase change memory (PCM), for which the resistivity of a cell depends on the crystalline or amorphous state of a chalcogenide. Although the underlying memory element for these (and possibly other) resistive memory technologies may vary, methods for writing to and reading from them can be electrically similar and are encompassed by embodiments of the present invention.

Writing a binary '0 or '1 into a cell typically involves driving an applied current through, or voltage across, the resistance element in the cell to force it into a higher-resistivity or a lower-resistivity state (e.g., by means of spin transfer torque with STT-MRAM, heating with PCM, metal migration with ReRAM, or metal ion flow with CBRAM).

Unfortunately, reliably and non-destructively reading such resistive memory elements can be challenging. It typically relies upon reliably and non-destructively detecting the resistance of the memory element. Existing solutions typically apply a constant DC current or voltage to the memory element. A sense amplifier or current mirror then compares the resulting current or voltage level to that of a reference cell with known resistance. At nominal supply levels, such read operations can risk destroying data since the current or voltage can easily exceed the magnitude necessary to change state of the memory element. A voltage clamp can reduce the magnitude of the current and voltage applied to the memory element, but this solution normally lowers the read margin and adds undesired loading. Operating the sense amplifier or current mirror at a higher supply voltage can recover the lost read margin, but this can require a significant expense of an additional regulator, power supply, and/or special high-voltage device(s). In addition, existing solutions usually need to apply a continuous and constant current in order to reach a steady state before sampling the output of the sense amplifier or current mirror. As the time duration of continuous DC current flow increases, the risk of destroying data also increases. Accordingly, new approaches may be desired.

In some embodiments, detecting resistance in a resistive memory cell may be done using a pulse edge. For example, a pulse may be applied through a resistive memory data cell and another through a reference delay circuit to determine which path has the larger delay in order to determine the resistive state of the data cell in question.

Figure 1:
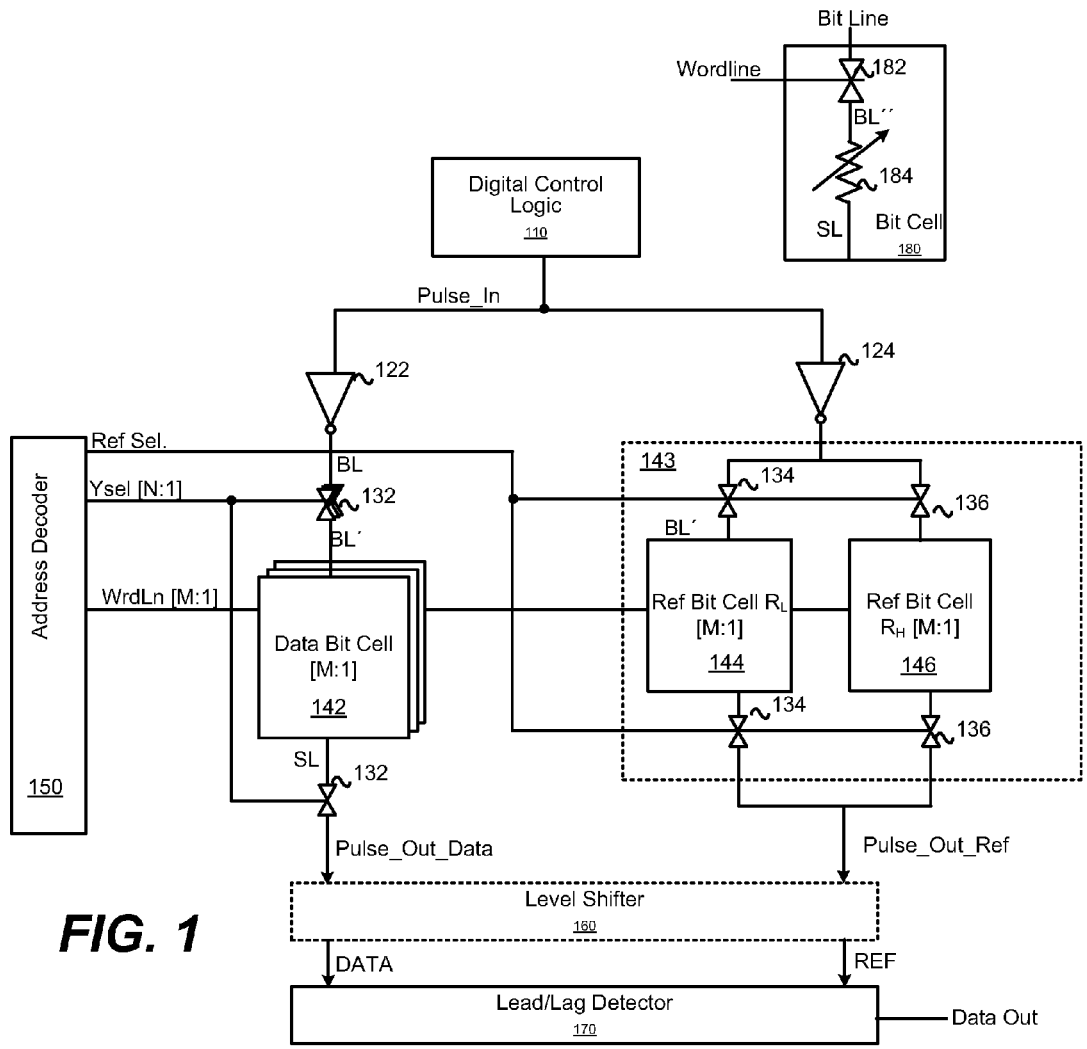
FIG. 1 shows a portion of a variable resistance memory array with read circuitry for reading cells in the array in accordance with some embodiments.

FIG. 1 shows a circuit for reading a memory cell in a resistive memory cell array in accordance with some embodiments. The circuit generally includes digital control logic 110, a lead/lag detector 170, and a resistive-element memory array comprising M-rows and N-columns of data bit cells 142, reference delay circuit 143, and address decoder 150, coupled as shown. A depicted reference delay circuit 143 includes a low level ($R_L$) cell 144 and a high level ($R_H$) cell 146.

The array also includes access devices (e.g., pass gates, PMOS transistor, NMOS transistor) 132, 134, and 136 for the decoder 150 to control access to a desired data cell and corresponding ref cells via control lines (Ysel, WordLn, Ref Sel.). Also included is a level shifter 160, which may be employed in some embodiments, if desired, to shift pulse signals (Pulse_Out_Data and Pulse_Out_Ref) to suitable levels for lead/lag detector 170. (It should be appreciated that the array configuration, row-column structure, etc. illustrated in the figure, does not dictate any particular configuration. For example, rows and columns could be transposed, and the cells could be decoded in any suitable manner. Moreover, if reference cells are used to implement the reference delay circuit, they need not necessarily be next to each other at the end of a row or column. They may be dispersed in any suitable manner in a row, column or other organizational structure.)

Each of the cells (142, 144, 146) may comprise a resistive memory cell such as cell 180, which includes an access device 182 and a variable resistance memory element 184 such as an STT or PCM element. A data cell 142 stores a data bit that may be at a first binary state (e.g., logic '0 at the low resistance level) or at a second binary state (e.g., logic '1 at the high resistance level). A low-level reference cell ($R_L$) 144 is set to the resistive memory element's low resistance level ($R_L$), while a high level reference cell ($R_H$) 146 is set to the resistive memory element's high resistance level ($R_H$). In the depicted implementation, for every N columns of data bit cells 142, there is a single M-row column of reference bit cells 144 fixed to the lower resistance state and a single M-row column of reference bit cells 146 fixed to the higher resistance state. (Note that some resistive memory can have more than 2 binary states, e.g., they may have 3 or more states. The invention is not limited to 2-state implementations. The time-domain state evaluation principles discussed herein may be used to read cells with 3 or greater states.)

During a read operation, the decoder 150 selects one row and one column of the memory array to address a single data bit cell 142. The Ysel signal, through access devices 132, select the column, and the WordLn signal selects the row. Likewise, for the reference bit cells 144, 146, the WordLn selects the same row as the data cell 142, and the Ref Sel. signal selects both reference columns. Selection activates access devices that electrically couple the read drivers (122, 124) on the bit line to the read sensing circuitry 160, 170 on the source line.

To sense the state of the selected data bit cell 142, digital control logic 110 sends a pulse on the Pulse_In signal at the nominal digital supply voltage (Vcc). CMOS drivers 122, 124 on both the data array and the reference array drive the pulse through the data bit cell 142 and in parallel through both reference bit cells (144, 146). The input pulse emerges at the bottom of the data array as Pulse_Out_Data and at the bottom of the reference array (delay circuit 143) as Pulse_Out_Ref. Both pulses terminate at transistor gates in the lead/lag detector 170, from the data and ref cells or by way of an optional level shifter 160. (The level shifter may be used if the access device does not pass appropriate signal levels for the utilized technology, e.g., full CMOS-level signals for CMOS detectors. In addition, a level shifter may also be desired if rising edges, e.g., through a positive pulse with a rising edge trigger, are to be evaluated.)

(Note that the pulse could either travel in an SL→BL direction or BL→SL direction. The pulse direction could be modified with respect to the memory element, for example, by (a) turning the entire bit cell upside down, (b) turning just the memory element upside down, e.g., STT-MRAM has unique top/bottom terminals, or (c) switching the locations of the read drivers and lead/lag detector. Note also that bit line (BL) and source line (SL) may be arbitrary distinctions. For example, in some embodiments, BL could be the node on the bit cell that is connected to the memory element and SL could be the node on the bit cell that is connected to the access transistor.)

The ref delay circuit 143 is configured so that the time delay from Pulse_In to Pulse_Out_Ref will be greater than the time delay from Pulse_In to Pulse_Out_Data when the data cell 142 is low (R=RL), but it will be less than the Pulse_In to Pulse_Out_Data delay when data cell 142 is at a high resistance (R=RH) state. (Below, it is shown how this can be achieved, with the RC time constant for the reference delay circuit 143 being in between the RC delays for a data cell at a low state and for a data cell at a high state. It should be appreciated that in the depicted embodiment, the reference delay circuit is implemented with first and second memory cells, representative of actual array data cells, in parallel with one another. They are programmed to be at low and high resistance states, respectively, in order to conveniently achieve an RC delay that is naturally in between RC delays for a low and for a high state. This is mathematically shown below. However, any suitable circuit for implementing a reference delay circuit could be used. For example, transistors, with or without added capacitance, could be biased to facilitate a desired RC delay. Alternatively, variable resistance material, chemically or otherwise modified to be at a desired resistance and/or capacitance could be used.)

The lead/lag detector determines which of the two pulses (Pulse_Out_Data or Pulse_Out_Ref) arrives at its inputs first, and in this way, determines if the data cell is low (data pulse arrived first) or high (reference pulse arrived first). It can be appreciated that with this approach, current flows through the memory element 184 for just a limited time, when a gate potential changes due to rising and falling edges of the pulse.

The RC time constants for a data cell (142) and the reference delay circuit (143) will now be discussed. Assuming a lumped RC model, the path from PULSE_IN to PULSE_OUT_DATA has an RC delay with an RC time constant of:

$$(R_{PARASITIC} + R_{DATA}) * C_{PARASITIC},$$

where R_PARASTIC [subscript] is the total parasitic resistance of the routing and devices along the route, R_DATA [subscript] is the resistance of the memory element 184 in the data bit cell 142 with a value of RL or RH, and C_PARASTIC [subscript] is the total parasitic resistance of the routing and the devices connected to the routing. Likewise, the path from Pulse_In to [[Pulse_Oout_Ref]] Pulse_Out_Ref has an RC delay with an RC time constant of:

$$[(R_{PARASITIC} + R_L) * (R_{PARASITIC} + R_H)] / [(R_{PARASITIC} + R_L) + (R_{PARASITIC} + R_H)] * 2C_{PARASITIC}.$$

When the memory element 184 in the selected data bit cell 142 is in the lower resistance state and has a resistance of $R_{DATA} = R_L$, then the edge of Pulse_Out_Data should arrive at the lead/lag detector 170 before the edge of Pulse_Oout_Ref. This condition is met if the RC delay from Pulse_In to Pulse_Out_Data is less than the RC delay from Pulse_In to Pulse_Out_Ref, or equivalently:

$$(R_{PARASITIC} + R_L) \cdot C_{PARASITIC} <$$
$$\frac{(R_{PARASITIC} + R_L) \cdot (R_{PARASITIC} + R_H) \cdot 2C_{PARASITIC}}{(R_{PARASITIC} + R_L) + (R_{PARASITIC} + R_H)}$$

$$(R_{PARASITIC} + R_L) \cdot C_{PARASITIC} <$$
$$\frac{(R_{PARASITIC} + R_L) \cdot (R_{PARASITIC} + R_H) \cdot 2C_{PARASITIC}}{2R_{PARASITIC} + R_L + R_H}$$

$$1 < \frac{2(R_{PARASITIC} + R_H)}{2R_{PARASITIC} + R_L + R_H}$$

$$2R_{PARASITIC} + R_L + R_H < 2(R_{PARASITIC} + R_H)$$

$$2R_{PARASITIC} + R_L + R_H < 2R_{PARASITIC} + 2R_H$$

$$R_L + R_H < 2R_H$$

$$R_L < R_H$$

Thus, for RDATA=R_L [subscript], the RC delay from Pulse_In to Pulse_Out_Data is less than the RC delay from Pulse_In to Pulse_Out_Ref if R_L [subscript] is less than R_H, which is a fundamental property of variable resistance memories.

Likewise, when the memory element 184 in the selected data bit cell 142 is in the higher resistance state and has a resistance of $R_{DATA} = R_H$, then the edge of Pulse_Out_Data should arrive at the lead/lag detector after the edge of Pulse_Out_Ref. This condition is met if the RC delay from Pulse_In to Pulse_Out_Data is greater than the RC delay from Pulse_In to Pulse_Out_Ref, or equivalently:

$$(R_{PARASITIC} + R_H) \cdot C_{PARASITIC} >$$
$$\frac{(R_{PARASITIC} + R_L) \cdot (R_{PARASITIC} + R_H) \cdot 2C_{PARASITIC}}{(R_{PARASITIC} + R_L) + (R_{PARASITIC} + R_H)}$$

$$(R_{PARASITIC} + R_H) \cdot C_{PARASITIC} >$$
$$\frac{(R_{PARASITIC} + R_L) \cdot (R_{PARASITIC} + R_H) \cdot 2C_{PARASITIC}}{2R_{PARASITIC} + R_L + R_H}$$

$$1 > \frac{2(R_{PARASITIC} + R_L)}{2R_{PARASITIC} + R_L + R_H}$$

$$2R_{PARASITIC} + R_L + R_H > 2(R_{PARASITIC} + R_L)$$

$$2R_{PARASITIC} + R_L + R_H > 2R_{PARASITIC} + 2R_L$$

$$R_L + R_H > 2R_L$$

$$R_H > R_L$$

Thus, for $R_{DATA} = R_H$, the RC delay from Pulse_In to Pulse_Out_Data is greater than the RC delay from Pulse_In to Pulse_Out_Ref if $R_H$ is greater than $R_L$, which is a fundamental property of variable-resistance memories. Accordingly, it can be seen that the relative arrival order of the Pulse_Out_

Data signal with respect to the Pulse_Out_Ref signal can be used to identify the state of variable-resistance memory element in a data bit cell.

A representative CMOS example will now be described. The example assumes the following RC values: $C_{PARASITIC}$=0.2 pF, $R_{PARASITIC}$=2 kΩ, $R_L$=4 kΩ and $R_H$=8 kΩ. For a data cell read, initially, the decoder 150 selects a data bit cell 142 and two corresponding reference bit cells 144/146, and the control logic 110 then applies an input pulse on Pulse_In. The inverted pulse appears at Pulse_Out_Ref and Pulse_Out_Data with the order of the edges determined by the state of the memory element 184 in the data bit cell 142. The lead/lag detector 170 then outputs a data '0' or a data '1' on Data Out, depending on the relative order of the edges of Pulse_Out_Ref and Pulse_Out_Data. In the example, with $R_{DATA}$=$R_H$, Pulse_Out_Data lagged Pulse_Out_Ref by 205 ps, resulting in the lead/lag detector 170 outputting a data '1. When $R_{DATA}$=$R_L$, Pulse_Out_Data led Pulse_Out_Ref by 135 ps, resulting in the lead/lag detector 170 outputting a data '0.

Figure 2:
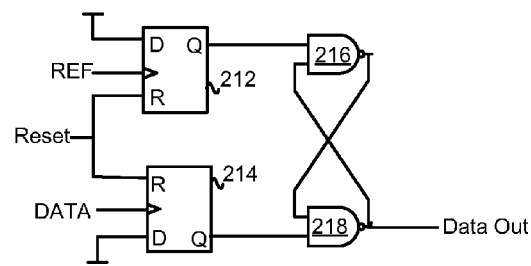
FIG. 2 shows a circuit for implementing a lead/lag detector in accordance with some embodiments.

FIG. 2 shows a possible lead/lag detector in accordance with some embodiments. It generally comprises flip-flops 212, 214 (e.g., high-gain D flip-flops) and a latch, e.g., an RS latch formed from high-gain cross-coupled NAND gates 216, 218, all coupled together as shown. The D inputs are tied to high values, reset inputs are connected to a Reset signal, and the edge-triggered clock inputs are coupled to REF and DATA inputs, which are coupled to the Pulse_Out_Ref and Pulse_Out_Data lines respectively. After Reset is asserted, the flip-flops outputs (Q outputs) are in low states, which results in the NAND gate outputs being in high states. In this overall state, the flip-flops are ready to preserve the order of the triggering edges (e.g., falling edges) from the DATA and REF pulses. If the REF edge arrives first, then the cross-coupled NAND gates latch a data '1 on the Data Out signal until the next Reset. On the other hand, if the DATA edge arrives first, the cross-coupled NAND gates latch a data '0 on the Data Out signal until the next Reset.

Figure 3:
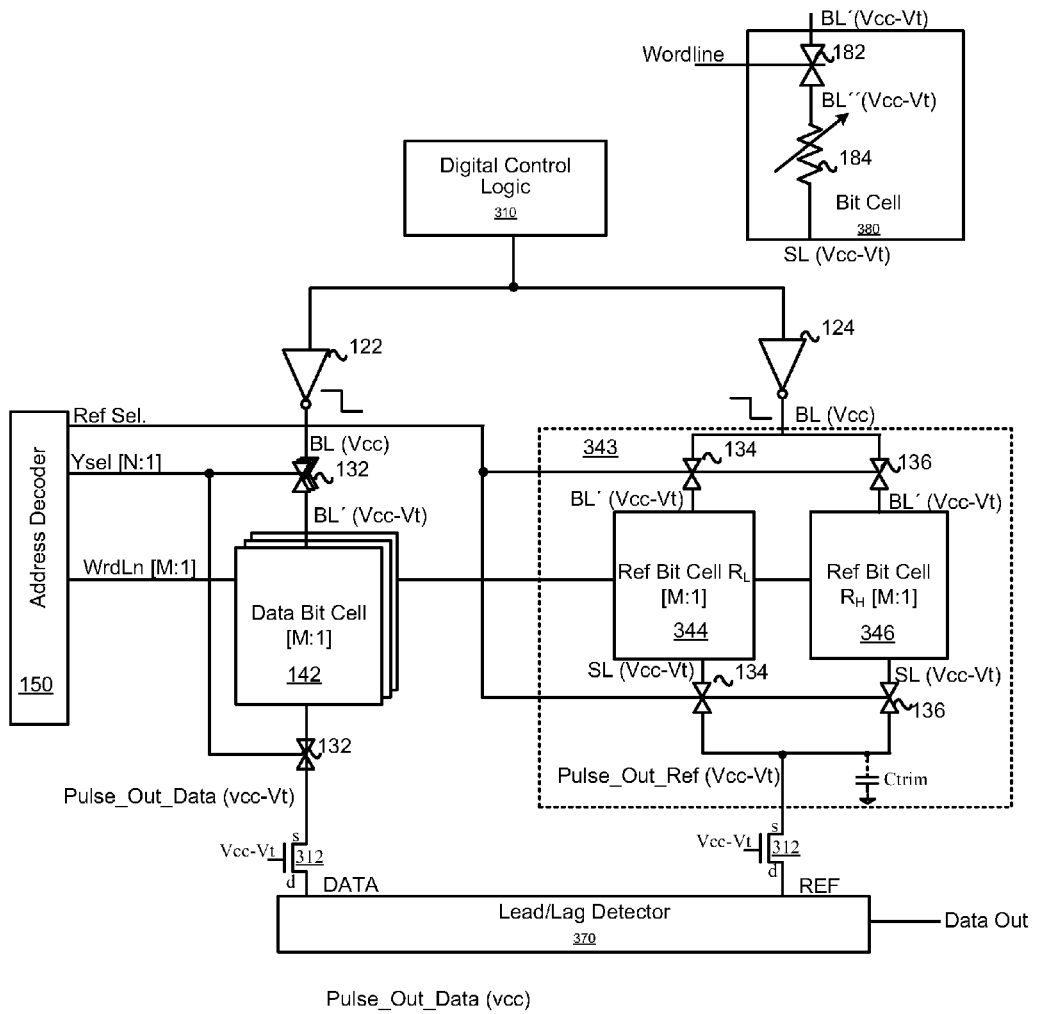
FIG. 3 shows a portion of a variable resistance memory array with read circuitry for reading cells in the array in accordance with additional embodiments.

FIG. 3 shows another example of a resistive memory array with lead/lag detection in accordance with some embodiments. This example, as indicated at the outputs of pulse drivers 122, 124, employs a falling pulse (leading edge transitions from a high to a low level). It has been appreciated that with this implementation (falling edge pulse with a lead/lag detector having falling-edge clock inputs), a level shifter may be omitted with more confidence. In some embodiments, as indicated in the figure, various nodes about the resistive elements in the data and reference cells are pre-charged prior to a read pulse operation. With a falling edge pulse being emitted from the drivers, their outputs are at Vcc as the read event occurs. Other nodes such as BL, BL', BL", SL, Pulse_Out_Ref, and Pulse_Out_Data are pre-charged to a level of Vcc-Vt, where Vt is the threshold voltage for PMOS transistors used in the circuit. Such pre-charging provides for a more consistant, reliable resistance in the variable resistance memory elements 184 when the read pulses are driven through them. (Note that these pre-charge levels need not be Vcc-Vt. A regulator, charge pump, or additional external power supply could supply any arbitrary pre-charge levels.)

With such pre-charging, in some embodiments, NMOS transistors 312 are included to decouple the memory array side elements from the lead/lag detector until the pulses arrive at the Pulse_Out_Data and Pulse_Out_Ref lines. As indicated, they are configured so that they couple the Pulse_Out_Data and Pulse_Out_Ref lines to the corresponding DATA and REF inputs of the lead/lag detector 370 through their source/drain channels, with their gates tied off at a voltage level of Vcc-Vt. In this way, the transistors (312) remain turned off until their sources (Pulse_Out_Ref, Pulse_Out_Data) drop to a level of Vcc-2Vt, which occurs when the falling edge pulses arrive. (it should be appreciated that the voltage biases at the various nodes could be provided in any suitable manner. For example, one or more PMOS transistors could be used to provide a Vcc-Vt supply at their drains, with their sources coupled to Vcc. A pre-charge signal could be coupled to their gates to turn on the Vcc-Vt supply when the nodes are to be pre-charged. In other implementations', a diode-connected NMOS device could provide a good Vcc-Vt level. A biased PMOS device could also be used. Moreover, the NMOS decoupling devices could be biased to other levels than Vcc-Vt. Vcc-Vt may be convenient to create with an NMOS device in a diode-connected configuration connected to Vcc but any suitable circuit could be used. Along these lines, the NMOS decoupling transistors could represent any number of actual decoupling transistors. For example, the 2 reference lines could be connected to 2 dedicated devices or the 2 reference lines could be connected to a single device.)

Note that the value of the reference delay can be trimmed to any desired delay between the two possible data delay levels (the range defined by RL and RH) in any suitable manner. For example, programmable series trim resistors or (as indicated in the figure) parallel trim capacitors (Ctrim) could be employed.

It can be appreciated that at least some embodiments disclosed herein may have some advantages over previous solutions. Because the resistance of memory elements may be detected in the time domain using pulse edges, such approaches can avoid the application of an excessively continuous DC current to the memory element. This reduces the risk of destroying data during a read operation. Further, most, if not all, sensing circuitry can operate at nominal voltage levels (between Vcc and Vss) with the read circuitry maintaining robust sensing margin without the expense of an additional regulator, power supply, or the like. Another benefit is that sensing a brief edge doesn't have to limit the maximum (or minimum) operating frequency, as compared to a method that requires sensing and sampling a stable current or voltage for a certain amount of time. The slope of the edge (and so the read margin) should not change with frequency.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a variable resistance memory cell;
   a reference delay circuit; and
   a detector coupled to the variable resistance memory cell and reference delay circuit to determine whether a pulse from the variable resistance memory cell arrives before a pulse from the reference delay circuit, wherein the pulse from the variable resistance memory cell has a leading edge that transitions from a high level to a low level, and wherein the pulse from the reference delay circuit has a leading edge that transitions from a high level to a low level.

2. The chip of claim 1, in which the detector is to generate an output indicative of whether the variable resistance memory cell pulse or reference delay circuit pulse arrives first in order to indicate a binary state of data in the variable resistance memory cell.

3. The chip of claim 2, in which the detector comprises first and second flip-flops with edge trigger clock inputs that are to receive the variable resistance memory cell and reference delay circuit pulses, wherein one of the first and second flip-flops asserts at its output if its pulse arrives at its clock input before the other flip-flop receives its pulse.

4. The chip of claim 3, in which the detector comprises a reset-set (RS) latch coupled to the flip-flop outputs.

5. The chip of claim 4, in which the RS latch comprises a pair of cross-coupled NAND gates.

6. The chip of claim 1, in which the reference delay circuit comprises a low resistance state cell and a high resistance state cell.

7. The chip of claim 5, in which the low and high resistance state cells are implemented with variable resistance memory elements of the type used for the variable resistance memory cell.

8. The chip of claim 7, in which the high and low reference cells are coupled in parallel with one another.

9. The chip of claim 1, in which the variable resistance memory cell comprises Spin Transfer Torque (STT) magnetic RAM element.

10. The chip of claim 1, in which the variable resistance memory cell comprises a Phase Change Memory (PCM) element.

11. A chip, comprising:
   a memory array having a group of variable resistance memory cells and a reference delay circuit; and
   a detector coupled to the variable resistance memory cells and to the reference delay circuit to assess a pulse from the group of variable resistance memory cells against a pulse from the reference delay circuit, wherein the pulse from the group of variable resistance memory cells has a leading edge that transitions from a high level to a low level, and wherein the pulse from the reference delay circuit has a leading edge that transitions from a high level to a low level.

12. The chip of claim 11, in which the detector is to generate an output indicative of a memory state for a selected memory cell in the group of variable resistance memory cells based on a received order for arriving memory cell and reference delay circuit pulses.

13. The chip of claim 11, in which the detector is to generate an output indicative of one of two or more possible memory states for a selected memory cell.

14. The chip of claim 11, in which the group of variable resistance memory cells constitutes a row of cells.

15. The chip of claim 11, in which the memory array is part of system memory for a processor in the chip.

16. The chip of claim 11, in which the memory reference delay circuit includes a variable resistive memory element of the type used in the variable resistance memory cells.

17. An apparatus, comprising:
   a decoder to select a variable resistance memory cell to be read; and
   a control circuit to initiate a first pulse to go through the selected variable resistance memory cell and to initiate a second pulse to go through a reference delay circuit; and
   a detector circuit coupled to the variable resistance memory cell and reference delay circuit to receive the first and second pulses and to determine a memory state for the variable resistance memory cell based on the relative order of arrival between the first and falling pulses, wherein the first pulse has a leading edge that transitions from a high level to a low level, and wherein the second has a leading edge that transitions from a high level to a low level.

18. The apparatus of claim 17, in which the first and second pulses are to be generated in parallel with one another at the same time.

19. The apparatus of claim 17, in which the reference delay circuit has low and high variable resistance memory elements.

* * * * *